United States Patent [19]

Kitagawa et al.

[11] Patent Number: 5,016,263
[45] Date of Patent: May 14, 1991

[54] SAMPLE-HOLD CIRCUIT WITH OUTPUTS TAKEN BETWEEN GATES OF DYNAMIC SHIFT REGISTER TO AVOID SKEW FROM UNEQUAL INTERSTAGE CONNECTION LENGTHS

[75] Inventors: Nobutaka Kitagawa, Kawasaki; Akihiro Sueda; Yasunori Kuwasima, both of Yokohama, all of Japan

[73] Assignee: Kabushiki Kaisha Toshiba, Kawasaki, Japan

[21] Appl. No.: 375,944

[22] Filed: Jul. 6, 1989

[30] Foreign Application Priority Data

Jul. 7, 1988 [JP] Japan ................... 63-169645

[51] Int. Cl.$^5$ .................... H03K 21/40; H03K 21/12; H03K 23/44; G11C 11/407
[52] U.S. Cl. .......................... 377/68; 377/76; 377/77; 377/79; 365/240
[58] Field of Search ................ 377/68, 76, 77, 78, 377/79, 104; 365/240

[56] References Cited

U.S. PATENT DOCUMENTS

| | | | |
|---|---|---|---|
| 3,657,699 | 4/1972 | Rocher et al. | 380/50 |
| 3,665,496 | 5/1972 | Donjon | 377/76 |
| 4,152,606 | 5/1979 | Hornak | 377/63 |
| 4,295,055 | 10/1981 | Takemoto et al. | 377/79 |
| 4,802,136 | 1/1989 | Nose et al. | 377/79 |
| 4,873,671 | 10/1989 | Kowshik et al. | 377/76 |

FOREIGN PATENT DOCUMENTS 2138615 10/1984 United Kingdom .

OTHER PUBLICATIONS

Hodges et al., "Potential of MOS Technologies for Analog Integrated Circuits", IEEE Journal of Solid-State Circuits, vol. SC-13, No. 3, Jun. 1978, pp. 285-294.

Primary Examiner—John S. Heyman
Attorney, Agent, or Firm—Foley & Lardner

[57] ABSTRACT

A sample-hold circuit comprises a large number of sample-hold elements, and a multi-stage shift register for controlling sampling timings of the sample-hold elments, including a large number of stages corresponding to respective sample-hold elements, wherein each of stages of the multi-stage shift register includes an input gate for taking a signal shifted from the preceding stage thereinto, an output gate for shifting the signal taken in by the input gate to the succeeding stage, respective sampling timings of the sample-hold elements corresponding to respective stages being determined by signals taken in between the input and output gates through the input gates at the respective stages. Waveforms of output signals from respective stages for determining the sampling timing are not affected by interstage wiring capacity. Accordingly, where a multistage shfit register is made up as a folded array, unevenness occurs in the interstage wiring capacity, but such an unevenness has no bad influence on the sampling timing.

8 Claims, 5 Drawing Sheets

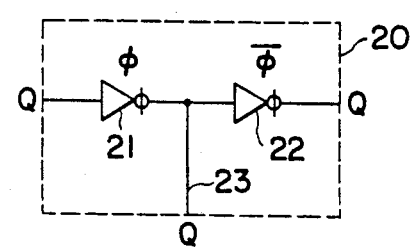
F I G. 7

SAMPLE-HOLD CIRCUIT WITH OUTPUTS TAKEN BETWEEN GATES OF DYNAMIC SHIFT REGISTER TO AVOID SKEW FROM UNEQUAL INTERSTAGE CONNECTION LENGTHS

BACKGROUND OF THE INVENTION

This invention relates to a sample-hold circuit, and more particularly to a sample-hold circuit used in a semiconductor device, such as, for example, a LCD (Liquid Crystal Display) driver for a liquid crystal television.

The LCD driver for liquid crystal television serves to sample video signals obtained by photographing to control lighting/non-lighting of respective liquid crystal elements in the LCD on the basis of sampled values. A sample-hold circuit used in such a LCD driver is of a structure including sample-hold elements provided respectively for those liquid crystal elements arranged in a matrix manner in the LCD, wherein the operation timings of respective sample-hold elements are shifted or delayed in sequence using outputs from respective stages of a shift register in order to shift timings at which those sample-hold elements sample video signals, in correspondence with shifts in respective scanning time points at the time of photographing.

FIG. 1 is a block diagram showing the configuration of a sample-hold circuit of this kind which has been developed for use in a LCD driver for a color liquid crystal television.

In the LCD for color liquid crystal television, liquid crystal elements 1Al, . . . , 1An and liquid crystal elements 1Bl, . . . , 1Bn, and liquid crystal elements 1Cl, . . . , 1Cn for respectively three primary color components A, B and C are interchangeably arranged as shown. For such liquid crystal elements 1Al, 1Bl, 1Cl, . . . , 1An, 1Bn, and 1Cn, sample-hold elements 2Al, 2Bl, 2Cl, . . . , 2An, 2Bn, and 2Cn for driving those elements are provided, respectively. These sample-hold elements are grouped according to colors of A, B and C of the liquid crystal elements for driving them. A group of elements 1Al, . . . , 1An are connected to a signal line 3A for a video signal $V_A$ of the color component A, a group of elements 1Bl, . . . , 1Bn are connected to a signal line 3B for a video signal $V_B$ of the color component B, and a group of elements 1Cl, . . . , 1Cn are connected to a signal line 3C of the video signal $V_C$. Each sample-hold element is composed of an analog switch 4 for sampling video signals $V_A$, $V_B$ or $V_C$, a capacitor 5 for holding a sampled video signal, and a converter 6 for converting the video signal subjected to holding to a lighting/non-lighting control signal for the liquid crystal element to output it therefrom. It is to be noted that respective converters 6 concurrently carry out an output operation every each scanning line.

Since respective liquid crystal elements 1Al, 1Bl, 1Cl, . . . , 1An, 1Bn, 1Cn are positionally shifted at a predetermined pitch as shown, it is required to shift timings for sampling by respective sample-hold elements 2Al, 2Bl, 2Cl, . . . , 2An, 2Bn, 2Cn in correspondence with shifts of scanning time points at the time of photographing corresponding to those positional shifts. To realize this, three columns of n bit shift registers 7A, 7B and 7C respectively driven by clocks $\phi_A$, $\phi_B$ and $\phi_C$ of three systems are provided. More particularly, outputs from the stages of the shift register 7A are connected to control terminals of analog switches 4 for sample-hold element group 1Al, . . . , 1An through a level shifter 8, respectively; outputs from the stages of the shift register 7B are connected to control terminals of analog switches 4 for the element group 1Bl, . . . , 1Bn through the level shifter 8, respectively; and outputs from the stages of the shift register 7C are connected to control terminals of analog switches 4 for sample-hold element group 1Cl, . . . , 1Cn through the level shifter 8, respectively. By the timing adjustment of clocks $\phi_A$, $\phi_B$ and $\phi_C$, the time points for shifting input Signals QA, QB and QC to respective stages of shift registers 7A, 7B and 7C of three columns are shifted or delayed every predetermined times. Thus, the sampling timings of respective sample-hold elements are shifted in sequence.

Such shift registers 7A, 7B and 7C employed in this embodiment may be n bit shift register of any structure in principle. It is a matter of course that an n bit shift register typically used from the past may be used. FIG. 2 shows a circuit diagram of one bit shift register constituting each stage of such a conventional typical n bit shift register. This one bit shift register 10 includes an input gate 11 comprised of a clocked inverter for taking a signal Q shifted from the preceding stage thereinto, an output gate comprised of a clocked inverter for shifting the signal Q thus taken in to the succeeding stage, and an external output line 13 for externally outputting the signal Q shifted from the output gate 12 to the succeeding stage.

The circuit configuration of the conventional n bit shift register thus constructed, which is used as the above-mentioned sample-hold circuit, is shown in FIG. 3. It is to be noted that only an extracted circuit section relevant to the video signal $V_A$ is shown in FIG. 3 for facility of understanding. The operation timing of the shift register in this circuit is shown in FIG. 4.

As shown in FIG. 3, output gates 12m, 12m+1, . . . of respective stages 10m, 10m+1, . . . of the shift register are placed in an on state in response to a rise of a reference clock $\phi_A$ serving as a reference for determining a sampling timing of the video signal $V_A$, and are placed in an output hold state in response to its fall. In addition, input gates 11m, 11m+1, . . . are placed in an on state in response to a rise of a clock $\overline{\phi_A}$ of the antiphase, and are placed in an output hold state in response to its fall. Thus, as shown in FIG. 4, for a time period from a rise to the next rise of the reference clock $\phi_A$, the output QAm of the m-th stage is maintained at a high level. For a subsequent time period from a rise to the next rise, the output QAm+1 of the (m+1)-th stage is maintained at a high level. For a further subsequent time period from a rise to the next rise, the output QAm+2 of the (m+2)-th stage is maintained at a high level. In a manner stated above, outputs of high level are shifted in succession to the succeeding stage every rises of the clock $\phi_A$.

As shown in FIG. 3, interstage wiring capacity C corresponding to the wiring length exists in each connection lines between respective stages of the shift register. For this reason, the output waveforms of respective stages of the shift register shown in FIG. 4 have a time constant $\tau$ expressed by the equation $\tau = C \cdot R$ where C represents the above-mentioned interstage wiring capacity and R represents an on resistance R of the output gate transistor. Accordingly, the output waveforms of the preceding and next stages of the shift register have an overlap at a portion transiently varying due to the time constant $\tau$. In FIG. 4, this overlap portion is indicated by broken lines.

At this overlap portion, an analog switch (e.g., switch 4Am) driven by an output of the preceding stage shifts to off state, while an analog switch (e.g., switch 4Am+1) driven by an output of the next stage shifts to on state. For this reason, a noise produced when the analog switch 4Am+1 of the next stage is turned on is input through signal line 3A to the analog switch 4Am of the preceding stage which is being turned off. Thus, a voltage difference (offset) is produced between an input voltage $V_A$ delivered to the analog switch 4Am and a voltage VAm held by the capacitor 5Am.

Since such a sample-hold circuit is constructed in a folded manner as shown in FIG. 3 from a viewpoint of restriction of circuit space, the interstage connection line at the folded portion (e.g., between the (m+2)-th stage and (m+3)-th stage) becomes longer than those at other portions. For this reason, the interstage wiring capacity Cm+2 at the folded portion also becomes larger than those at other portions. As a result, the time constant $\tau$ of the output QAm+2 to which this capacity relates is prolonged. Accordingly, as shown in FIG. 4, the time period during which the output QAm+2 having a prolonged time constant and the output QAm+1 of the preceding stage overlap with each other becomes shorter than other overlap periods, while the time period during which this output QAm+2 and the output QAm+3 of the succeeding stage becomes longer than others. As a result, as shown in FIG. 5, hold voltages VAm, VAm+1, ... of respective sample-hold elements would produce offset variations. Such variations cause noise in the form of a longitudinal stripe or interdigital noise on a television screen driven by hold voltages.

SUMMARY OF THE INVENTION

An object of this invention is to provide a sample-hold circuit constructed so that offsets of hold voltages of respective sample-hold elements are uniform even where any folded portion exists in the interstage wiring of the shift register, thereby permitting the quality of a picture formed on a television screen, etc. to be satisfactory.

A sample-hold circuit according to this invention includes a large number of sample-hold elements, and a multi-stage shift register for controlling the sampling timings, including a large number of stages corresponding to respective sample-hold elements, each stage of the multi-stage shift register including an input gate for taking a signal shifted from the preceding stage thereinto, and an output gate for shifting the signal taken in by the input gate to the succeeding stage, the sampling timings of sample-hold elements corresponding to respective stages being determined by signals taken in between the input and output gates through input gates at respective stages.

In accordance with the above-mentioned circuit configuration, the time constant of an output waveform of each stage of the shift register is determined by a wiring capacity between the input and output gate of each stage and an on resistance of the input gate transistor. Accordingly, the time constant of the output waveform of each stage is not affected by the interstage wiring capacity. Even when the shift register is constructed as a folded array, the time constants at all the stages are equal to substantially the same value. As a result, overlapping portions of respective stage output waveforms of the shift register have all substantially the same width, so offsets of hold voltages of respective sample-hold elements produced due to the presence of those overlapping portions become uniform. For this reason, the picture quality of a pictorial image formed by those hold voltages becomes satisfactory.

BRIEF DESCRIPTION OF THE DRAWINGS

FIG. 7 is a circuit diagram of one bit shift register constituting each stage of an n bit shift register of the embodiment of FIG. 6.

This invention will be now described in more detail in accordance with an embodiment shown.

Figure 1:
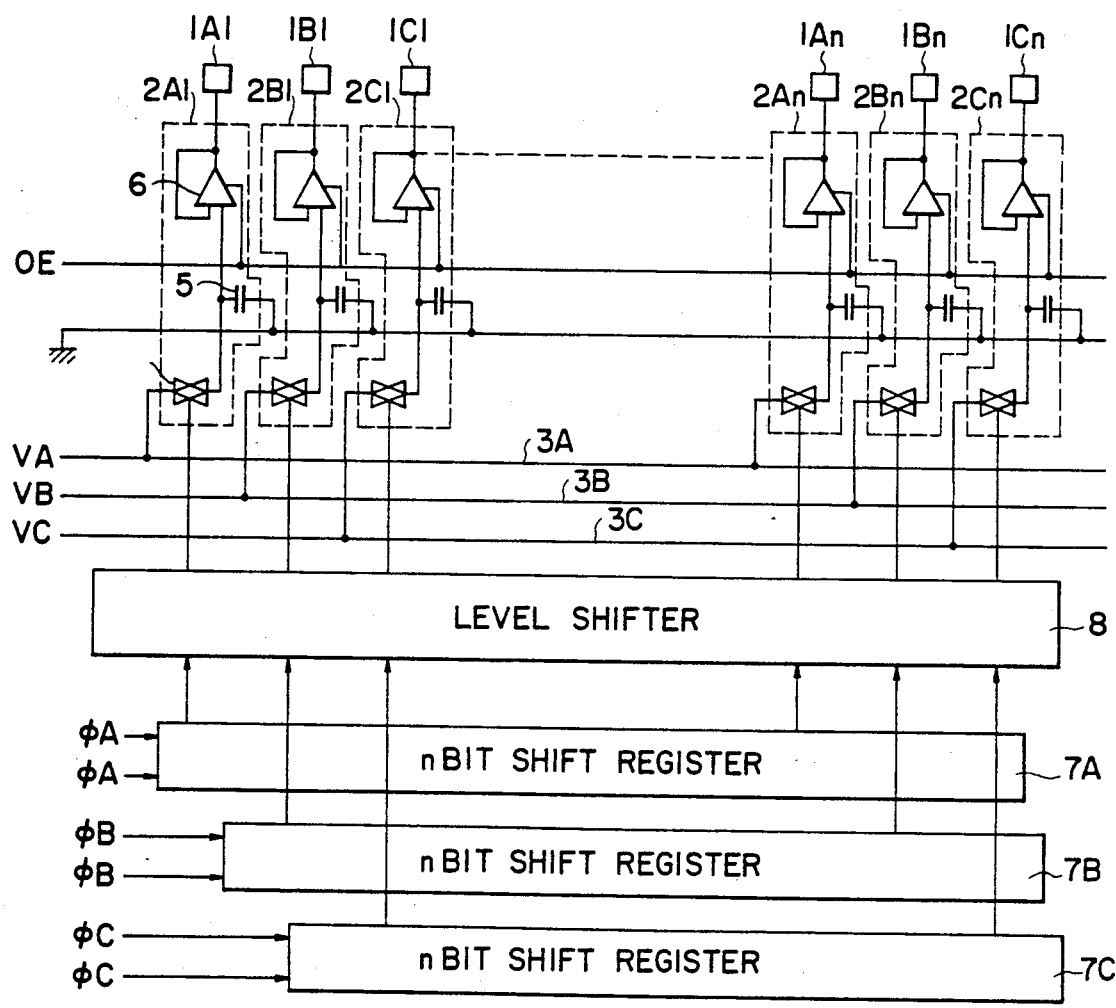
FIG. 1 is a block diagram of a sample-hold circuit developed for use in a LCD driver for a color liquid crystal television.
Figure 2:
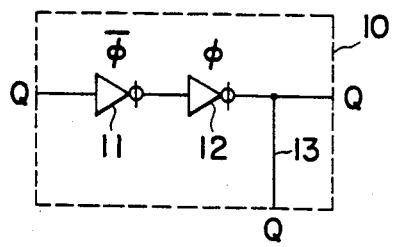
FIG. 2 is a circuit diagram of one bit shift register constituting each stage of a conventional typical n bit shift register.
Figure 6:
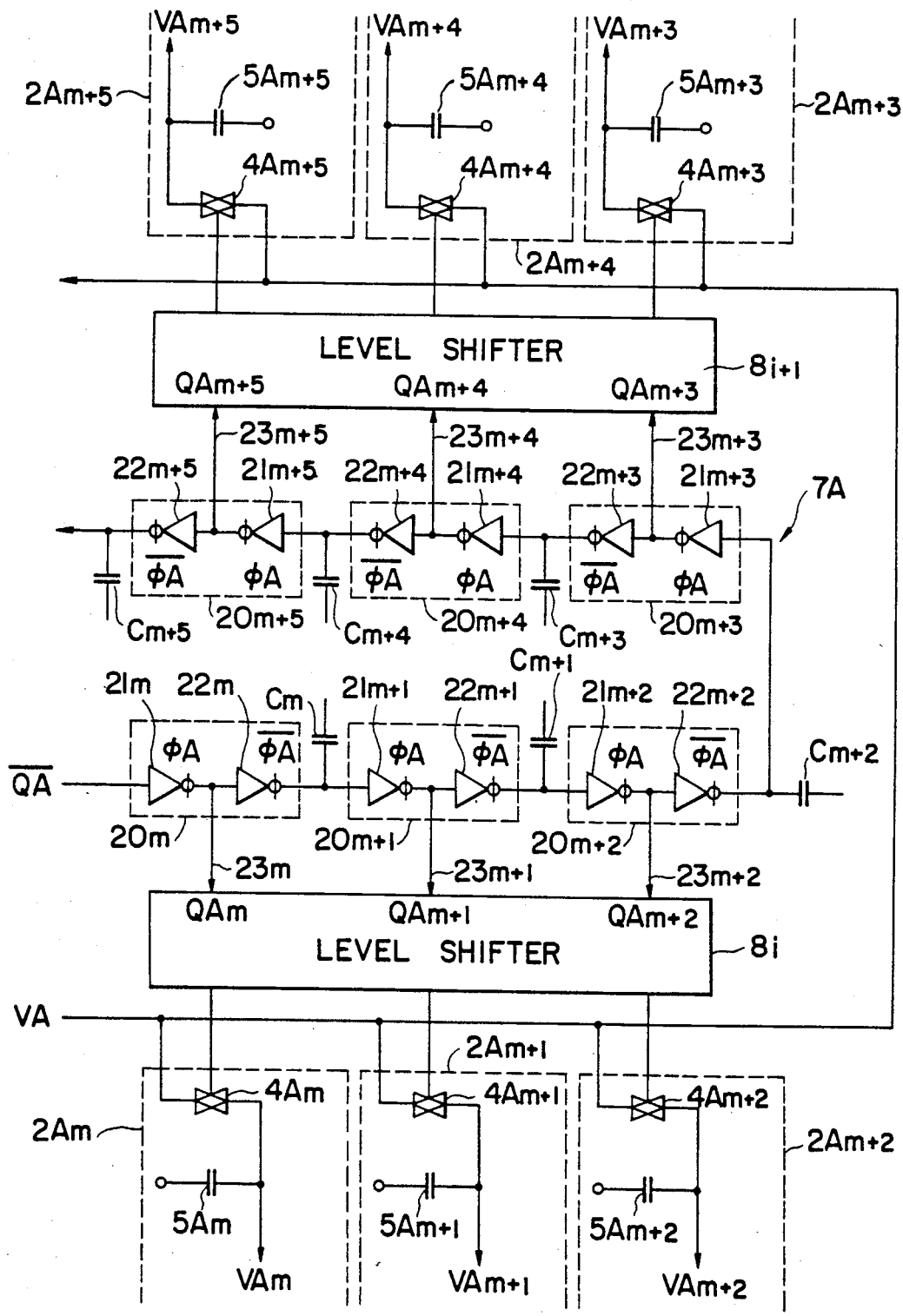
FIG. 6 is a block diagram showing a partial circuit configuration of an embodiment of a sample-hold circuit according to this invention.

FIG. 6 shows a circuit configuration of a preferred embodiment of a sample-hold circuit according to this invention. In this embodiment, the invention is applied to a sample-hold circuit for a color liquid crystal television of an elementary structure as shown in FIG. 1, and only an extracted circuit portion relevant to a video signal $V_A$ is shown in FIG. 6. FIG. 7 shows a circuit configuration of one bit shift register constituting each stage of an n bit shift register of this embodiment.

Figure 3:
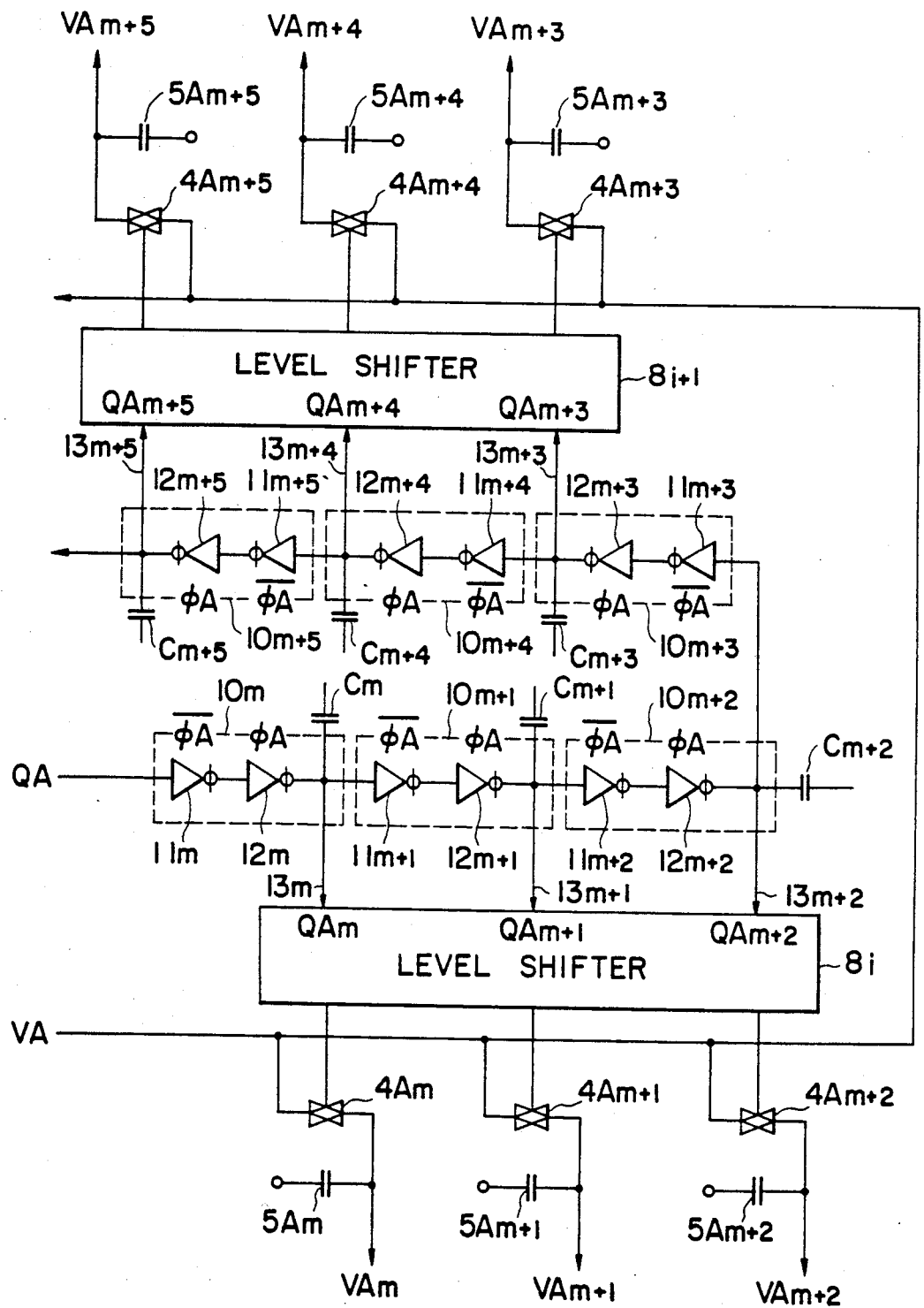
FIG. 3 is a partial circuit diagram of the sample-hold circuit of FIG. 1 in which conventional typical n bit shift register is used.
Figure 4:
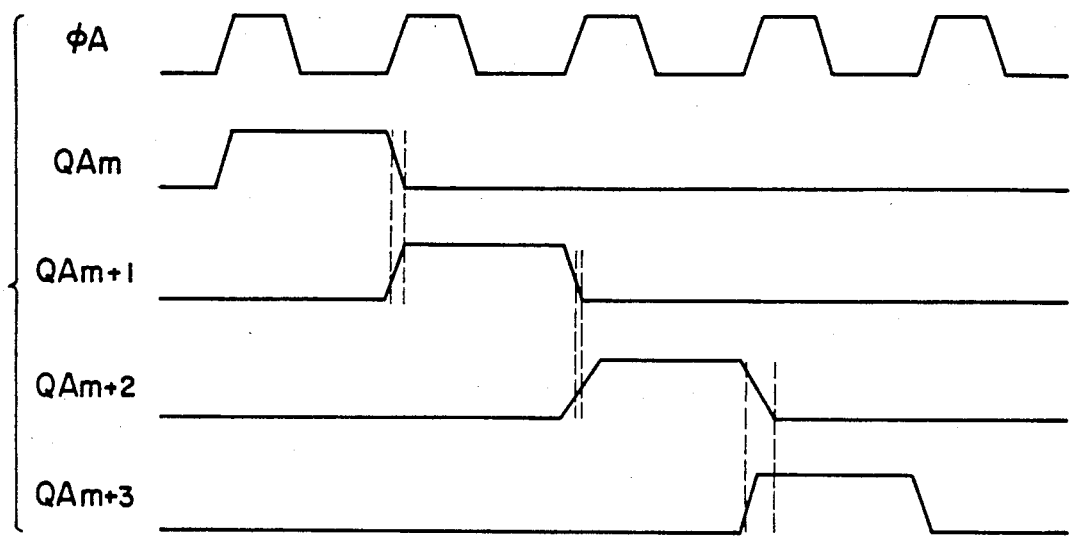
FIG. 4 is a timing chart showing the operation of the n bit shift register in the circuit of FIG. 3.
Figure 5:
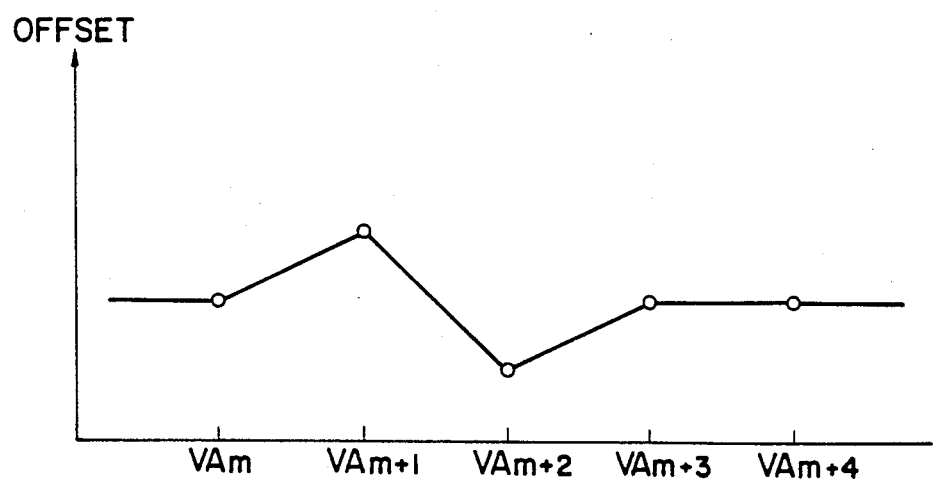
FIG. 5 is a graphical representation of changes in offset of hold voltages of respective sample-hold elements in the circuit of FIG. 3.

The circuit in this embodiment differs from the circuit of FIG. 3 which has been already described in the configuration of an n bit shift register. Namely, the n bit shift register of this embodiment is such that one bit shift register constituting each of stages 20m, 20m+1, ... includes, as shown in FIG. 7, an input gate 21 comprised of a clocked inverter for taking a signal Q shifted from the preceding stage thereinto, an output gate 22 comprised of a clocked inverter for shifting the signal Q thus taken in to the succeeding stage, and an external output line 23 connected to the wiring between input and output gates 21 and 22 to externally output the signal Q taken in through the input gate 21. Moreover, as shown in FIG. 6, input gates 21m, 21m+1, ... of respective stages are placed in an on state in response to a rise of a reference clock $\phi_A$ serving as a reference for determining the sampling timing of a video signal $V_A$ and are placed in an output hold state in response to its fall. Output gates 22m, 22m+1 ... are placed in an on state in response to a rise of a clock $\bar{\phi}_A$ of an antiphase and are placed in an output hold state in response to its fall. Further, an input signal QA of a negative logic is delivered to the n bit shift register. Signals held between the input and output gates of respective stages 20m, 20m+1, ... are delivered to level shifters 8i and 8i+1 through external output lines 23m, 23m+1, ... In these shifters, those signals are converted to ones having a predetermined voltage level, and are then applied, as control signals, to analog switches 4Am and 4Am+1 for inputting the video signal $V_A$ to respective sample-hold elements, reSpectively.

The circuit portions relevant to video signals $V_B$ and $V_C$ which are not shown in FIG. 6 are of the same structure as above. A shift register 7B for controlling a sampling timing of the video signal $V_B$ is driven by clocks $\phi_B$ and $\overline{\phi}_B$. Similarly, a shift register 7C for controlling a sampling timing of the video signal $V_C$ is driven by clocks $\phi_C$ and $\overline{\phi}_C$. These clocks $\phi_A$, $\phi_B$ and $\phi_C$ have phase differences therebetween corresponding to shifts in scanning time points at the time of photographing corresponding to positional shifts between liquid crystals $|A|$, $|B|$ and $|C|$.

Figure 8:
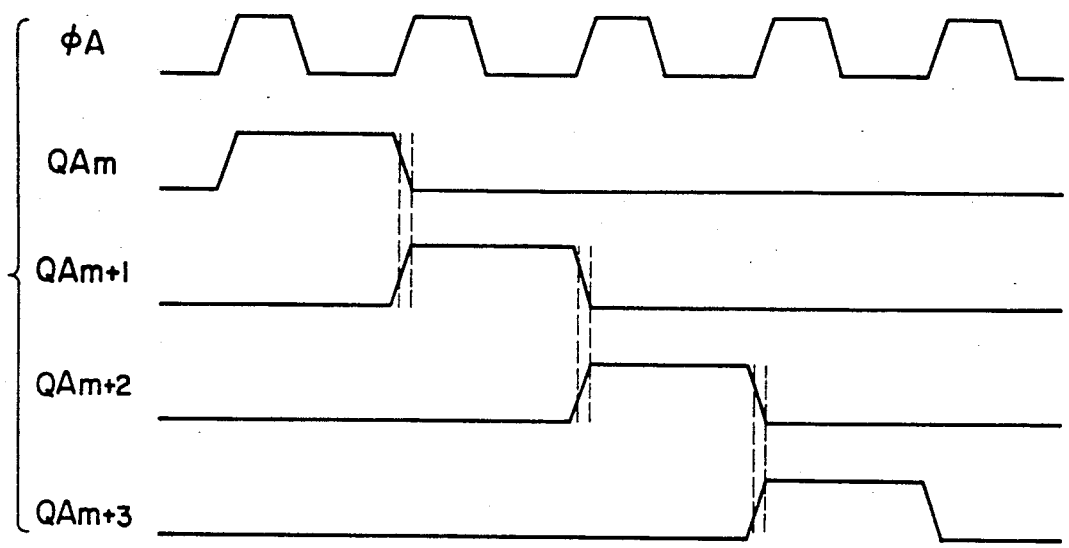
FIG. 8 is a timing chart showing the operation of the n bit shift register in the embodiment of FIG. 6.
Figure 9:
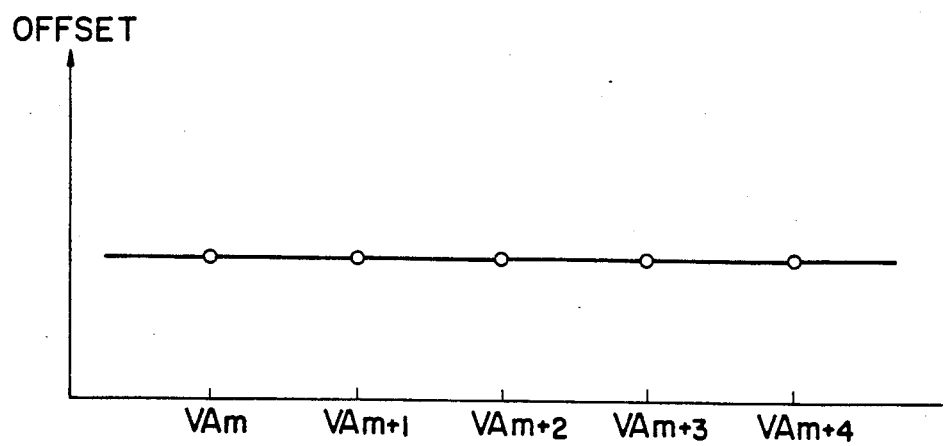
FIG. 9 is a graphical representation of changes in offset of hold voltages of respective sample-hold elements in the embodiment of FIG. 6.

FIG. 8 shows an operation timing of the shift register of FIG. 6. As shown, the basic operation of this shift register is substantially the same as that of the conventional shift register of FIG. 3 in that an output of the m-th stage is maintained at a high level for a time period from a rise of the reference clock $\phi_a$ to a subsequent rise, and that an output QAm+1 of the next stage is maintained at a high level for a time period from the next rise to a rise subsequent thereto.

However, the shift register of this embodiment is of a structure such that outputs QA, QAm+1, ... of respective stages are taken out from the portion between input and output gates 21 and 22 of respective stages. Accordingly, the time constants of those output waveforms are determined by a wiring capacity between input and output gates 21 and 22 and an on resistance of the input gate transistor. Namely, such time constants are not affected by interstage wiring capacities Cm, Cm+1, ... Even in the case where this bit shift register is constructed as a folded array as a whole, the folded portion is assigned to interstage wiring. Thus, respective stages 20m, 20m+1, ... may be made up by one bit shift registers of the same configuration, respectively, so time constants of the output waveforms are the same in all the stages. Accordingly, since the overlapping portions of the output waveforms of respective stages all have the same width, offsets produced in hold voltages VAm, VAm+1, ... of respective sample-hold elements all become uniform, resulting no possibility that there occurs noise in the form of longitudinal stripe or interdigital noise on a television screen.

It is to be noted that while explanation has been made by taking an example of a color liquid crystal television in the above-described embodiment, this invention is not limited to such an embodiment, and is therefore applicable to various equipment such as a monochromatic liquid crystal television, a copy machine, facsimile, and an image printer, etc. as long as a sample-hold circuit of the system of driving a large number of sample-hold elements by shift register can be used therein.

As described above, in accordance with this invention, respective stage outputs of the multi-stage shift register for determining sampling timings of respective sample-hold elements are taken out from the portion between input and output gates constituting respective stages. For this reason, even in the case where the shift register is constructed as a folded array, the time constants of respective stage output waveforms are substantially the same without being affected by the interstage wiring capacity, and therefore offsets of hold voltages of respective sample-hold elements become uniform. As a result, the picture quality of a pictorial image formed on the basis of such hold voltages becomes satisfactory. In addition, since no special addition circuit is provided for taking such a measure for offset, there is no possibility of an increase in the circuit area, alteration of the operation timing of the system, an increase in cost, and the like.

What is claimed is:

1. A sample-hold circuit comprising a large number of sample-hold elements, and a multi-stage shift register in which interstage connections at some stages are of different lengths from other stage interconnections, said shift register employed for controlling sampling timings of said sample-hold elements, including a large number of stages corresponding to said respective sample-hold elements, each stage of said multi-stage shift register including an input gate for taking a signal shifted from the preceding stage there into, and an output gate for shifting the signal taken in by said input gate to the succeeding stage, respective sampling timings of said sample-hold elements corresponding to respective stages being determined by signals taken between said input and output gates through said input gates at said respective stages thereby obtaining substantially equal output overlap among the stages despite said unequal interconnection lengths of said some stages.

2. A sample-hold circuit as set forth in claim 1, wherein said input gates of respective stages and said output gates of respective stages of said multi-stage shift register are driven by control signals having phases opposite to each other.

3. A sample-hold circuit as set forth in claim 1, wherein each of said stages of said multi-stage shift register includes an input gate comprised of a first clocked inverter driven by a first clock, an output gate comprised of a second clocked inverter driven by a second clock having a phase opposite to that of said first clock, and an external output line connected to a connection wiring between said input gate and said output gate, respective sampling timings of said sample-hold elements corresponding to respective stages being determined by signals output from the external output lines of said respective stages.

4. A sample-hold circuit as set forth in claim 1, wherein said multi-stage shift register is of a structure folded at the predetermined interstage wiring portion.

5. A sample and hold circuit comprising:
a plurality of sample and hold elements, each sample and hold element including a plurality of interconnected multistage shift registers in which interstage connections at some stages are of different lengths from other stage interconnections, each multistage shift register comprising:
an input gate having an input side for receiving a signal shifted from one of an input and a previous stage and an output side driving a transmission medium;
an output gate having an input side for receiving through the transmission medium a signal from the input gate and an output side for transmitting a signal to one of a subsequent stage and an output; and
an external output line connected to the transmission medium between the first and second gates the external output lines of each stage providing substantially equal output periods among the stages, irrespective of time constants associated with interconnections among the stages due to said unequal interconnection lengths of said some stages.

6. The sample and hold circuit recited in claim 5 wherein the interconnections among the stages have different capacities.

7. The sample and hold circuit recited in claim 5 wherein the interconnections among the stages are of different physical lengths.

8. A method of substantially equalizing overlap of outputs among a plurality of multistage shift registers interconnected by connections of different capacities, the method comprising the steps of:

receiving an input to each stage at an input side of a first gate driving an input of a second gate with an output of the first gate through a transmission medium;

driving a subsequently interconnected stage with an output of the second gate; and driving an external output of each stage from the transmission medium between the first and second gates to obtain substantially equal output overlap among the stages despite said different capacity interconnections.

* * * * *